United States Patent
Wang et al.

(10) Patent No.: US 6,803,548 B2
(45) Date of Patent: Oct. 12, 2004

(54) BATCH-TYPE HEAT TREATMENT APPARATUS AND CONTROL METHOD FOR THE BATCH-TYPE HEAT TREATMENT APPARATUS

(75) Inventors: Wenling Wang, Tokyo-To (JP); Koichi Sakamoto, Tokyo-To (JP); Fujio Suzuki, Tokyo-To (JP); Moyuru Yasuhara, Tokyo-To (JP); Sunil Shah, Los Altos, CA (US); Pradeep Pandey, San Jose, CA (US); Mark Erickson, Sacramento, CA (US)

(73) Assignee: Tokyo Electron Limited, Tokyo-To (JP)

( * ) Notice: Subject to any disclaimer, the term of this patent is extended or adjusted under 35 U.S.C. 154(b) by 191 days.

(21) Appl. No.: 09/950,876

(22) Filed: Sep. 13, 2001

(65) Prior Publication Data

US 2002/0045146 A1 Apr. 18, 2002

(30) Foreign Application Priority Data

Sep. 13, 2000 (JP) ........................................ 2000-278526

(51) Int. Cl.⁷ ................................................ H05B 1/02
(52) U.S. Cl. ........................................ 219/494; 219/497
(58) Field of Search ................................ 219/483, 486, 219/492, 497, 494, 425, 505; 373/136; 392/417, 416; 700/31, 121; 702/84

(56) References Cited

U.S. PATENT DOCUMENTS

| | | | | |
|---|---|---|---|---|
| 5,517,594 A | | 5/1996 | Shah et al. | ................. 392/416 |
| 5,616,264 A | * | 4/1997 | Nishi et al. | ................. 219/494 |
| 5,661,669 A | * | 8/1997 | Mozumder et al. | ........... 702/84 |
| 5,739,505 A | * | 4/1998 | Hasegawa et al. | .......... 219/494 |
| 5,895,596 A | * | 4/1999 | Stoddard et al. | ............ 219/497 |
| 6,041,172 A | | 3/2000 | Shah et al. | ............ 395/500.27 |

OTHER PUBLICATIONS

European Search Report (EP 01 20 3454), dated Dec. 2, 2003.

* cited by examiner

*Primary Examiner*—Tu Ba Hoang
(74) *Attorney, Agent, or Firm*—Smith, Gambrell & Russell, LLP

(57) ABSTRACT

A heat treatment apparatus for making a heat treatment while estimating temperatures of objects-to-be-processed that can estimate correct temperatures of the objects-to-be-processed. A reaction tube includes heaters and temperature sensors, and receives a wafer boat. A controller estimates temperatures of wafers and temperatures of the temperature sensors in zones in the reaction tube corresponding to the heaters by using the temperature sensors and electric powers of the heaters. Based on relationships between estimated temperatures of the temperature sensors and really metered temperatures, functions expressing the relationships between the estimated temperatures and the really metered temperatures are given for the respective zones. The functions are substituted by the estimated wafer temperatures to correct the estimated wafer temperatures. Electric powers to be fed to the respective heaters are respectively controlled so that the corrected wafer temperatures are converged to target temperature trajectories.

21 Claims, 5 Drawing Sheets

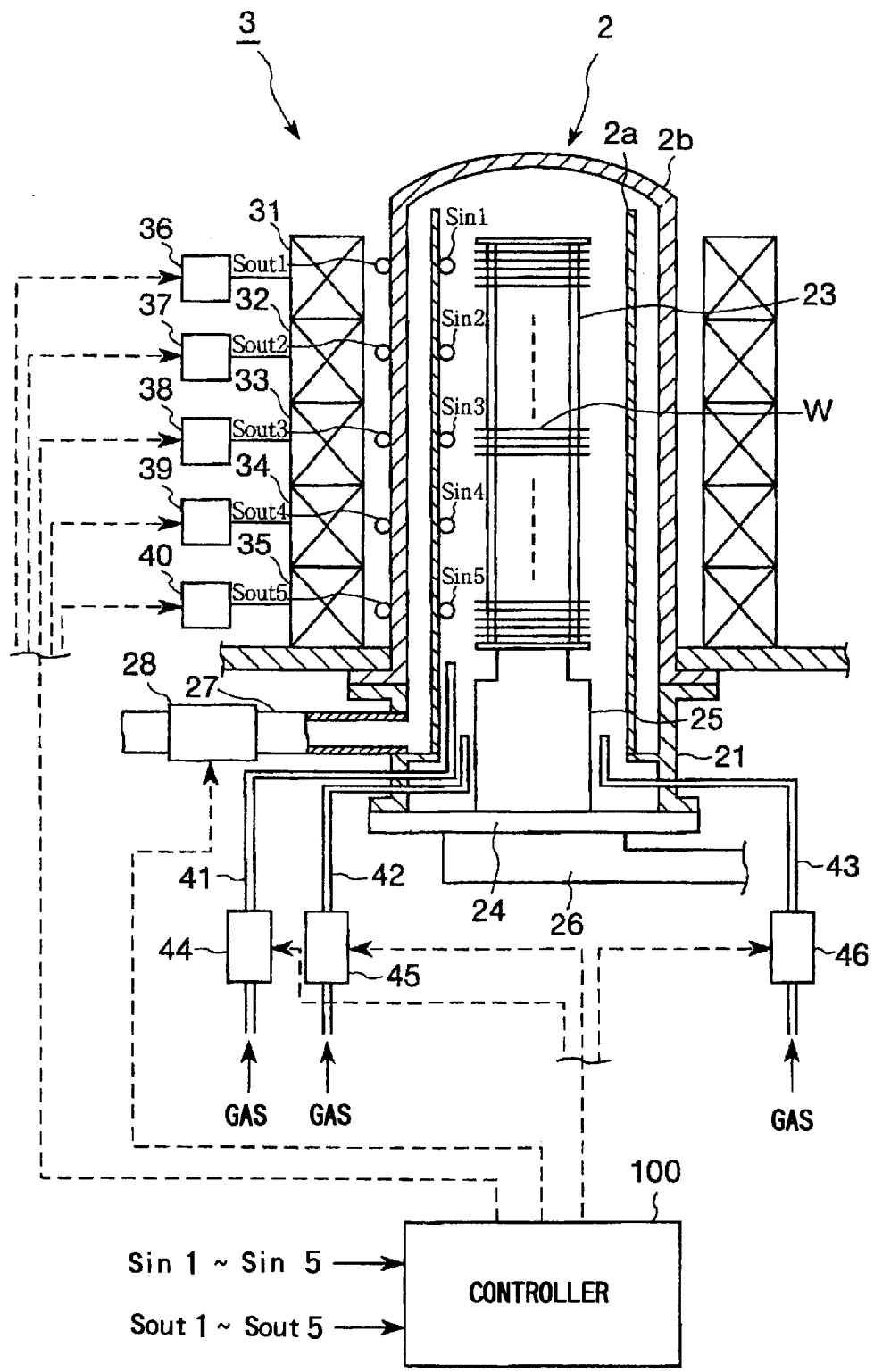
F I G. 2

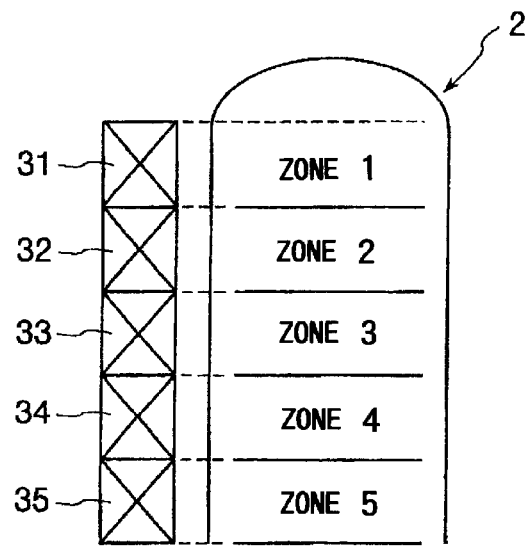
F I G. 5A
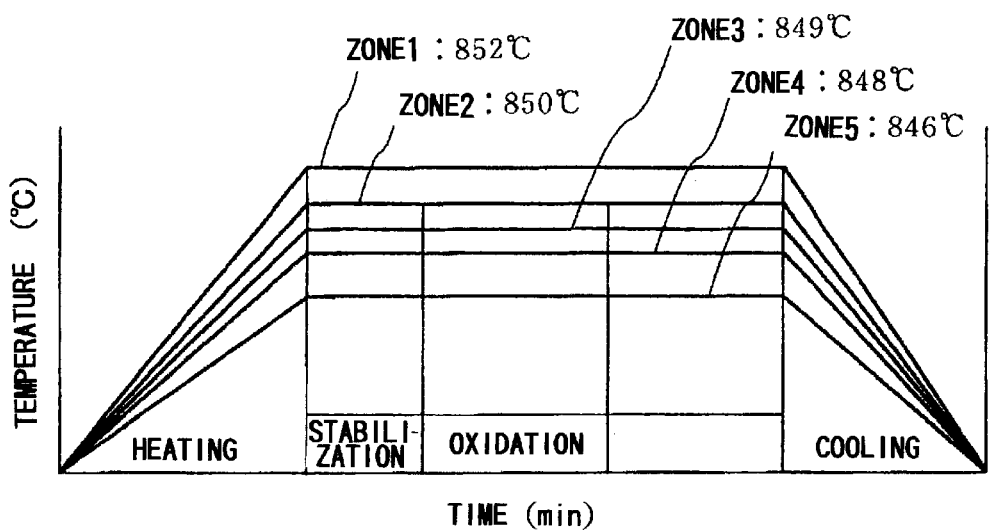
F I G. 5B

BATCH-TYPE HEAT TREATMENT APPARATUS AND CONTROL METHOD FOR THE BATCH-TYPE HEAT TREATMENT APPARATUS

CROSS REFERENCE TO RELATED APPLICATIONS

The present application is related to subject matter disclosed in Japanese Patent Application No. 2000-278526 filed on Sep. 13, 2000 in Japan to which the subject application claims priority under Paris Convention and which is incorporated herein by reference.

BACKGROUND OF THE INVENTION

1. Field of the Invention

The present invention relates to a batch-type heat treatment apparatus for heat-treating in batch a number of objects-to-be-processed, such as semiconductor wafers or others, more specifically, to a batch-type heat treatment apparatus of adaptive control-type which estimates temperature of loaded semiconductor wafers and, based on an estimation result, conducts optimum control, and to a control method for the batch-type heat treatment apparatus.

2. Related Background Art

As batch-type heat treatment apparatus for performing film forming processing, oxidation processing or diffusion processing on a number of semiconductor wafers in batch, horizontal heat treatment apparatus and vertical heat treatment apparatus are known. Recently, the vertical heat treatment apparatus have become dominant for the reason that the vertical heat treatment apparatus take in little atmospheric air.

FIG. 1 is a view showing the appearance of the conventional heat treatment apparatus. This heat treatment apparatus comprises a vertical heating furnace 11, and a wafer boat 12 which is a wafer holder. The heating furnace 11 has heaters provided around a vertical reaction tube. A gas feed pipe 11a and an exhaust pipe 11b are connected to the heating furnace 11.

The wafer boat 12 has a plurality of support rods 13. Objects-to-be-processed, wafers W, have the peripheral edges supported in grooves formed in the respective support rods 13, whereby the wafers W are held, laid one above the other in shelves-like manner at a certain pitch. The wafer boat 12 with a number of wafers W mounted on is loaded into the heating furnace 11 through an opening formed in the bottom of the heating furnace 11 to be subjected to a required heat treatment.

In the control system of such heat treatment apparatus, treatment conditions (target values of treatment parameters), such as treatment temperature, treatment pressure, gas flow rate, etc., are determined corresponding to, e.g., a kind, a thickness, etc. of a thin film to be formed. A plurality of recipes containing these treatment conditions is prepared. Respective operators select recipes corresponding to kinds and film thicknesses of thin films to operate the heat treatment apparatus, based on the pre-determined treatment conditions.

The heat treatment apparatus makes heat treatments while controlling treatment conditions, such as treatment temperature, treatment pressure, gas flow rate, etc., to correspond to target values of the recipes.

For a suitable treatment, temperatures of the wafers, internal pressures of the heating furnace, gas flow rates, etc. must be measured.

Internal pressures in the heating furnace, and gas flow rates can be relatively correctly measured respectively by a pressure gauge and a mass flow controller or others, which includes a flow meter disposed in the feed pipe. However, it is difficult to measure wafer temperatures.

It can be proposed, for example, to mount temperature sensors on wafers and load the wafers in the heating furnace. However, no semiconductor element can be formed on portions where the temperature sensors are mounted on, and there is a risk that the interior of the heating furnace is generally polluted to resultantly lower yields of semiconductor devices.

It can be proposed to measure temperatures of an ambient atmosphere around the wafers. However, this method cannot correctly measure temperatures of the wafers.

Art for solving these problems is disclosed in, e.g., the specification of U.S. Pat. No. 5,517,594. In this art, a plurality of temperature sensors are arranged in a heating furnace, and temperatures of wafers are estimated second after second by using a mathematical model, based on outputs of the temperature sensors, electric powers fed to heaters, etc., so as to control electric powers of the heaters.

This art can incontiguously measure (estimate) wafer temperatures relatively correctly to thereby control a heat treatment apparatus without causing metal contamination.

However, even by this art, temperatures estimated (computed) based on the mathematical model do not often correspond to real temperatures due to, e.g., difference between a real system and a system used in preparing the mathematical model, and difference between environments for a real heat treatment and environments where the mathematical model was prepared, different processes, etc. In such cases, heater power is controlled, based on erroneous wafer temperatures, and required treatments cannot be made on wafers.

SUMMARY OF THE INVENTION

One object of the present invention is to provide a heat treatment apparatus which estimates temperatures of objects-to-be-processed by using a mathematical model to make heat treatments, based on the estimated temperatures of the objects-to-be-processed, and which can estimate correct temperatures of the objects-to-be-processed.

Another object of the present invention is to provide a batch-type heat treatment apparatus which can fabricate semiconductor devices of high reliability and high yields, and a method for controlling the batch-type heat treatment apparatus.

To achieve the above-described objects, the batch-type treatment apparatus according to the present invention comprises a heating furnace including a heater and a temperature sensor, for an object-to-be-processed to be loaded in; a first-temperature-estimator for estimating a temperature of the object-to-be-processed in the heating furnace, based on an output of the temperature sensor, by using a model for estimating a temperature of the object-to-be-processed in the heating furnace and a temperature of the temperature sensor itself, based on an output of the temperature sensor; a second-temperature-estimator for estimating a temperature of the temperature sensor itself by using the model; a corrector for correcting the temperature estimated by the first-temperature-estimator, based on the temperature indicated by the output of the temperature sensor and the temperature of the temperature sensor estimated by the second-temperature-estimator; and a controller for controlling the heater, based on a temperature corrected by the corrector.

According to this invention, temperatures of the temperature sensor are really metered and estimated by using the model. Relationships between the estimated temperatures and the really metered temperatures can be given. Temperatures of an object-to-be-processed and temperatures of the temperature sensor are estimated by the common model, which makes the relationships between the really metered temperatures and the estimated temperatures of the temperature sensor applicable substantially similarly to relationships between real temperatures and estimated temperatures of the object-to-be-processed. Such relationships, etc. are applied to the estimated temperatures of the object-to-be-processed, whereby the estimated temperatures of the object-to-be-processed are corrected to give substantially correct temperatures of the object-to-be-processed, and by using the correct temperatures of the object-to-be-processed, the heater can be controlled.

The corrector includes means for giving a relationship "f" between, for instance, the temperature estimated by the second-temperature-estimator and the temperature indicated by the output of the temperature sensor, and applying to the relationship "f" the temperature of the object-to-be-processed estimated by the first-temperature-estimator to thereby correct the temperature of the object-to-be-processed estimated by the first-temperature-estimator.

Specifically, the corrector gives, for instance, an offset (offset=really metered temperature−estimated temperature) of the temperature indicated by the output of the temperature sensor from the temperature, as a reference, estimated by the second-temperature-estimator, and adds the offset to the temperature estimated by the first-temperature-estimator to thereby correct the temperature of the object-to-be-processed estimated by the first-temperature-estimator.

Otherwise, the corrector gives a ratio "k" (K=really metered temperature/estimated temperature) of the temperature indicated by the output of the temperature sensor to the temperature of the temperature sensor estimated by the second-temperature-estimator, and multiplies the temperature of the object-to-be-processed estimated by the first-temperature-estimator with the ratio "k" to thereby correct the estimated temperature of the object-to-be-processed.

The above-described model includes a heater control model for controlling the heater to approximate the estimated temperature of the object-to-be-processed to a target value.

The above-described model is for estimating a temperature, e.g. the temperature of the object-to-be-processed in the heating furnace and the temperature of the temperature sensor itself, based on a temperature, e.g. the output of the temperature sensor and a control signal for the heater. The first-temperature-estimator estimates the temperature of the object-to-be-processed in the heating furnace, based on the output of the temperature sensor and the control signal for the heater, and the second-temperature-estimator estimates the temperature of the temperature sensor, based on the output of the temperature sensor and the control signal for the heater.

The above-described controller includes a recipe memory for storing a recipe for temperature changes to be applied to the object-to-be-processed, and the controller controls the temperature estimated by using the model so that the estimated temperature of the object-to-be-processed changes in accordance with the recipe stored in the recipe memory.

The above-described recipe memory stores recipes corrected corresponding to a plurality of zones of the interior of the heating furnace divided in the direction of arrangement of the objects-to-be-processes, and the controller controls the heaters in accordance with the recipes for the respective zones.

The above-described controller controls the heaters so that offsets of sets of the estimated temperatures of the objects-to-be-processed corrected by the corrector from sets of temperatures indicated by the recipes for the plural zones are minimized.

To achieve the above-described objects, the method for controlling a batch-type heat treatment apparatus according to the present invention comprises a heating furnace including a heater and a temperature sensor, for an object-to-be-processed to be loaded in, comprises estimating a temperature of an object-to-be-processed in the heating furnace and a temperature of the temperature sensor itself, based on an output of the temperature sensor by using a model for estimating a temperature of the object-to-be-processed in the heating furnace and a temperature of the temperature sensor itself, based on an output of the temperature sensor; comparing a temperature indicated by the output of the temperature sensor with the temperature of the temperature sensor estimated by using the model; correcting the estimated temperature of the object-to-be-processed in accordance with a comparison result; and controlling the heater in accordance with a corrected temperature of the estimated temperature of the object-to-be-processed.

BRIEF DESCRIPTION OF THE DRAWINGS

FIG. 2 is a view of the heat treatment apparatus according to one embodiment of the present invention, which shows a structure thereof.

FIG. 5A is a view of zones in the reaction tube.

FIG. 5B is a view of an example of the target temperature trajectories for the respective zones.

DESCRIPTION OF THE PREFERRED EMBODIMENTS

Figure 1:
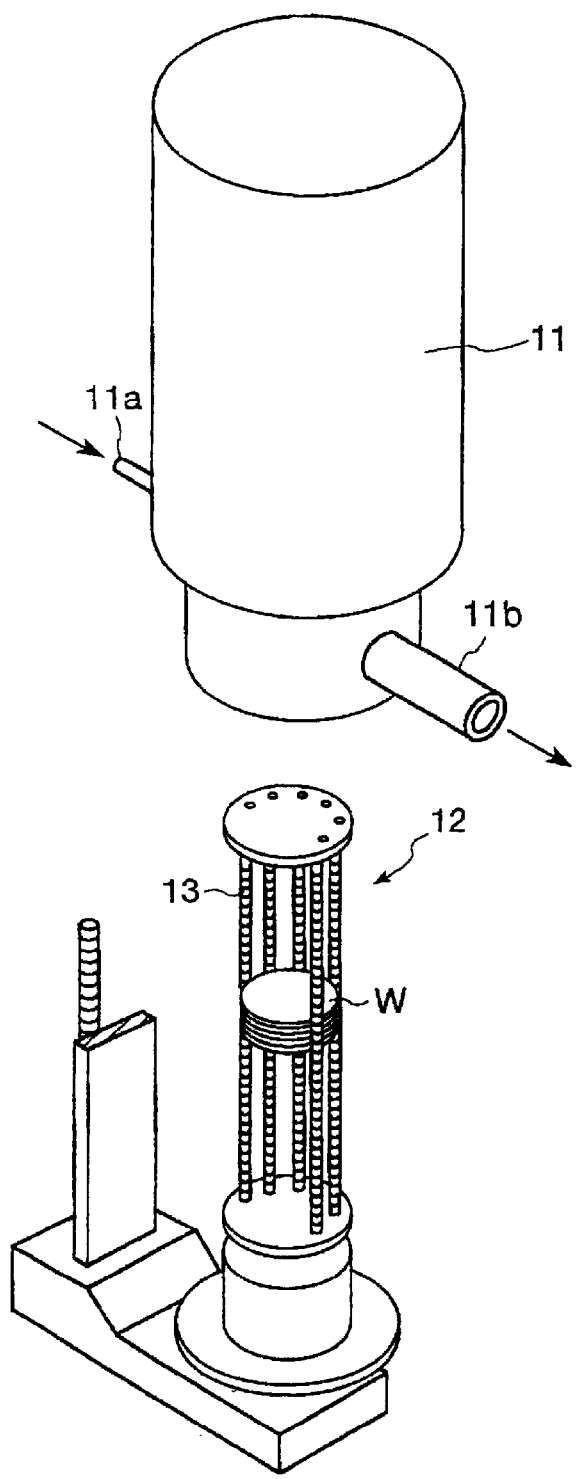
FIG. 1 is a view of the conventional heat treatment apparatus, which shows a structure thereof.

The batch-type heat treatment apparatus according to one embodiment of the present invention in which the batch-type heat treatment apparatus according to the present invention is applied to a vertical heat treatment apparatus will be explained.

As shown in FIG. 2, the vertical heat treatment apparatus comprises a reaction tube 2 of a double structure including an inner pipe 2a and an outer pipe 2b which are formed of, e.g., quartz, and a cylindrical manifold 21 of metal disposed on the bottom of reaction tube 2.

The inner tube 2a has the top interrupted, opened and is supported by the manifold 21. The outer tube 2b has the top uninterrupted, closed and has the lower end adhered air-tight to the upper end of the manifold 21.

In the reaction tube 2, a number of sheets(substrates), e.g., 150 sheets of objects-to-be-processed, wafers W (product wafers) are mounted on a wafer boat 23, a wafer holder, horizontally one above the other at a certain pitch in a shelves-like manner. The wafer boat 23 is held on a lid 24 through a heat insulation cylinder (heat insulator) 25.

A heater 3 in the form of, e.g., a resistor is disposed around the reaction tube 2. The heater 3 comprises 5 stages of heaters 31–35. The respective heaters 31–35 are supplied with electric powers independently of one another from their associated electric power controllers 36–40. The reaction tube 2, the manifold 21 and the heater constitute a heating furnace.

The heaters 31–35 divide the interior of the reaction tube 2 in 5 zones as shown in FIG. 5A.

The manifold 21 has a plurality of gas feed pipes for feeding gases into the inner tube 2a. In FIG. 2, for the convenience of ready understanding, 3 gas feed pipes 41, 42, 43 are shown. Dichlorosilane, ammonium and nitrogen are respectively fed to the respective gas feed pipes 42, 42, 43 through flow rate adjusters 44, 45, 46, such as mass flow controllers (MFCs). An exhaust pipe 27 is connected to the manifold 21 for the exhaustion through the gap between the inner pipe 2a and the outer pipe 2b. The exhaust pipe 27 is connected to a vacuum pump not shown. A pressure adjuster 28 including a combination valve, a butterfly valve, valve drivers, etc. is inserted in the exhaust pipe 27 for adjusting a pressure in the reaction tube 2.

Five thermocouples (temperature sensors) Sin1–Sin5 are disposed on the inside of the inner tube 2a in vertical alignment with each other. The thermocouples Sin1–Sin5 are covered with, e.g., quartz pipes for the prevention of metal contamination of semiconductor wafers W. The thermocouples Sin1–Sin5 are arranged corresponding to the 5 zones shown in FIG. 5A.

A plurality of thermocouples (temperature meters) Sout1–Sout5 are disposed on the outside of the outer pipe 2b in vertical alignment with each other. The thermocouples Sout1–Sout5 as well are arranged corresponding to the 5 zones shown in FIG. 5A.

The vertical heat treatment apparatus includes a controller 100 which controls treatment parameters, such as a temperature of a treatment atmosphere, a gas flow rate and pressure in the reaction tube 2. The controller 100 receives output signals of the thermocouples Sin1–Sin5 and Sout1–Sout5 to output control signals to the electric power controllers 36–40, the pressure adjuster 28 and the flow rate adjusters 44–46.

Figure 3:
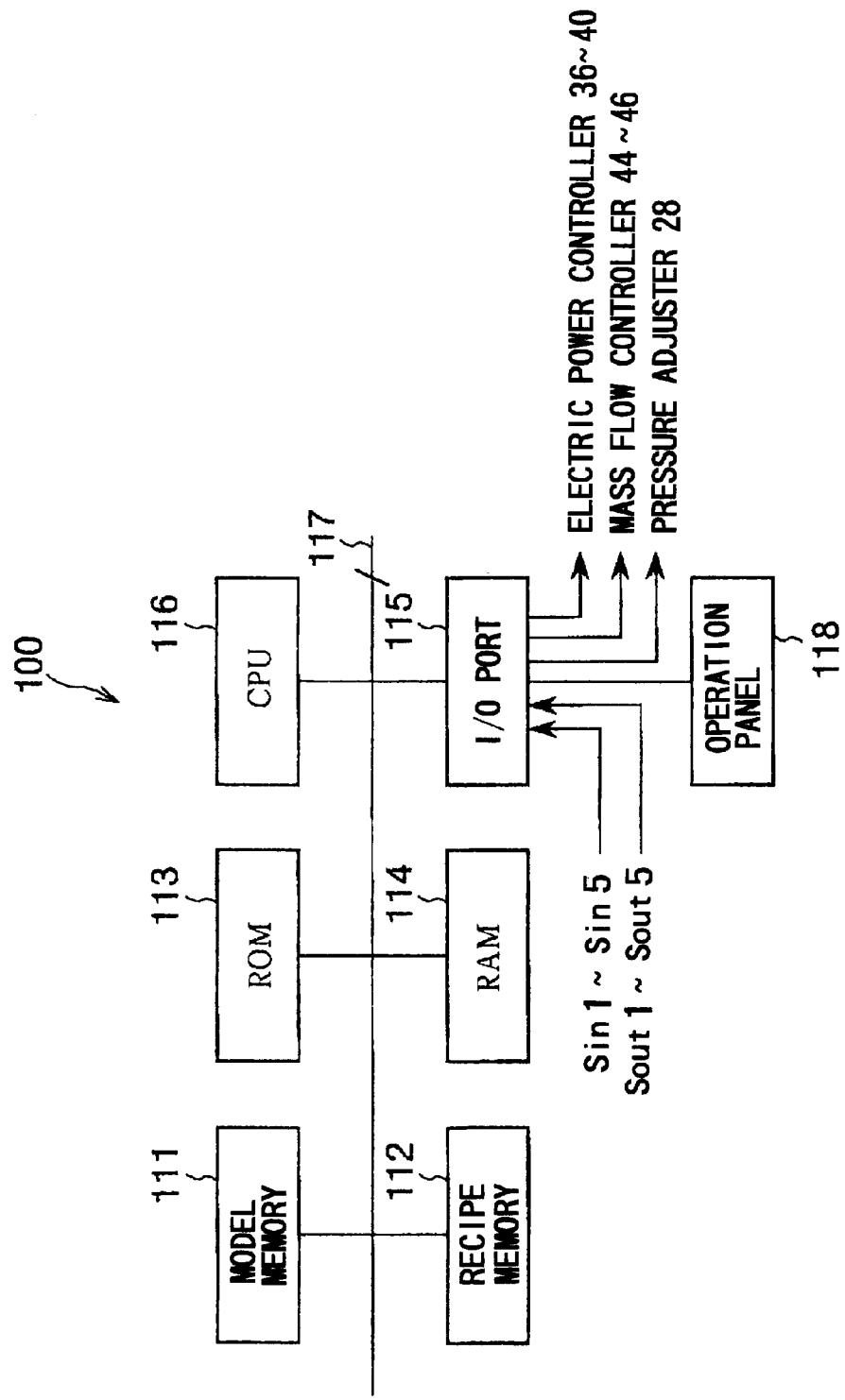
FIG. 3 is a block diagram of an example of the structure of the controller.

FIG. 3 shows a structure of the controller 100.

As shown in FIG. 3, the controller 100 comprises a model memory 111, a recipe memory 112, a ROM 113, a RAM 114, an I/O port 115, a CPU 116 and a bus interconnecting these members.

The model memory 111 stores a model M.

The model M is a heater control model (mathematical model: higher degree multidimensional function) designed to estimate temperatures of wafers W mounted on the wafer boat 23 in the respective zones, and temperatures of the thermocouples Sin1–Sin5, based on output signals (metered temperatures) of the thermocouples Sin1–Sin5 and Sout1–Sout5 and fed electric powers to the heaters 31–35 (corresponding to control signals to the electric power controllers 36–40 connected to the heaters 31–35), and further to command electric powers to be fed to the heaters 31–35 so as to approximate estimated temperatures to target values.

The model M is prepared for, e.g., each temperature zone.

The recipe memory 112 stores a plurality of kinds of recipes for deciding control sequences corresponding to kinds of film forming processing to be carried out by the heat treatment apparatus. Each recipe includes temperature recipes set for the respective zones as shown in FIG. 5B.

The ROM 113 comprises an EEPROM, a flush memory, a hard disc, etc. and is a storage medium for storing an operation program, etc. of the CPU 116.

The RAM 114 functions as work areas, etc. of the CPU 116.

The I/O port 115 supplies metered signals of the thermocouples Sin1–Sin5 and Sout1–Sout5 and outputs control signals outputted by the CPU 116 to the respective members. The I/O port 115 is connected to an operation panel 118.

The bus 117 transmits information among the respective members.

The CPU 116 can be a DSP or others, and executes a control program stored in the ROM 113 and, based on commands from the operation panel 118, controls operations of the heat treatment apparatus in accordance with a recipe stored in the recipe memory 112.

Specifically, the CPU 116 retrieves a model M stored in the model memory 111 or selects and retrieves a required one of a plurality of recipes stored in the recipe memory 112, and executes processing operations in accordance with the recipe.

Figure 4:
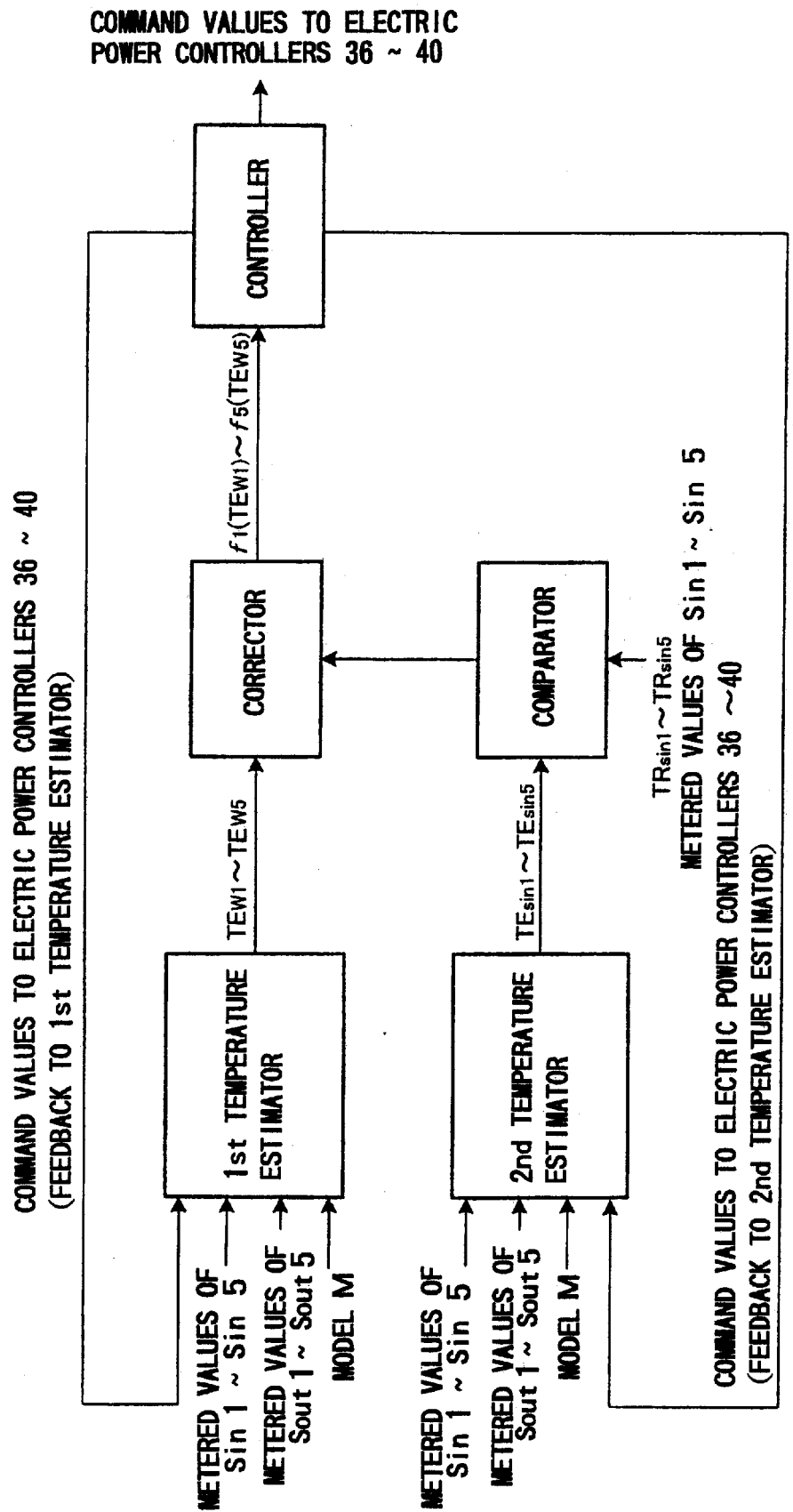
FIG. 4 is a block diagram of the CPU, which shows a function thereof.

Especially in the present embodiment, the CPU 116 has the structure for making the functions as shown in FIG. 4. The CPU 111 receives metered values of the thermocouples Sin1–Sin5 and Sout1–Sout5 and command values (control signal values corresponding to electric powers to be fed to the heaters 31–35), etc. to the electric power controllers 36–40, etc. and estimates, by the model M, temperatures of wafers W in Zone 1 to Zone 5 by a first-temperature-estimator and temperatures of the thermocouples Sin1–Sin5 by a second-temperature-estimator.

Furthermore, a comparator compares estimated temperatures TEsin1–TEsin5 of the thermocouples Sin1–Sin5 with really metered temperatures (own temperatures) TRsin1–TRsin5 of the thermocouples Sin1–Sin5 to give relationships between both. Based on given relationships, a corrector corrects the estimated temperatures TEw1–TEw5 of the wafers.

Then, the controller outputs command values corresponding to optimum feed electric powers to the electric power controllers 36–40 so that the corrected wafer temperatures Tw1–Tw5 can correspond to values commanded by the temperature recipe.

The CPU 116 outputs commands, etc. to the flow rate controllers 44–46 and the pressure adjuster 28, as in the ordinary control of heat treatment apparatus.

Then, film forming processing by the batch-type heat treatment apparatus of the above-described structure will be explained.

Product wafers (wafers to be processed) W are mounted on the wafer boat 23.

The wafer boat 23 is loaded into the reaction tube 2. An operator commands the start of the processing through the operation panel 118. In response to the command, the CPU 116 retrieves a processing model and a recipe respectively from the model memory 111 and the recipe memory 112.

In accordance with the retrieved recipe, the heater 3 is supplied with current, and the heater 3 starts to increase its temperature. Furthermore, the CPU 116 applies output signals of the thermocouples Sin1–Sin5 and Sout1–Sout5 and heater electric powers (corresponding to control signals to the electric power controllers 36–40) to the retrieved model M to estimate (computes) wafer temperatures TEw1–TEw5 in the five zones, the uppermost zone (Zone 1), the upper zone (Zone 2), the middle zone (Zone 3), the lower zone (Zone 4) and the lowermost zone (Zone 5), and temperatures TEsin1–TEsin5 of the thermocouples Sin1–Sin5.

The CPU 116 compares the estimated temperatures TEsin1–TEsin5 of the thermocouples Sin1–Sin5 with temperatures (really metered temperatures) indicated by output signals of the thermocouples Sin1–Sin5, and, based on a comparison result, corrects the estimated temperatures TEw1–TEw5 of the wafers.

An arbitrary correction method can be used. For example, a function fm for holding the relationship TRsinm=fm (TEsinm) (where m is 1, 2, 3, 4, or 5) is given, TEsinm in the function fm is substituted by an estimated wafer temperature TEwm, and fm(TEwm) can be a corrected wafer temperature.

Specifically, in a case, for example, where really metered temperatures TRsin1–TRsin5 of the thermocouples Sin1–Sin5 are values given by adding an offset value $\Delta$offset1–$\Delta$offset5 to estimated temperatures TEsin1–TEsin5, the estimated wafer temperatures TEw1–TEw5 are corrected to TEw1+$\Delta$offset1–TEw5+$\Delta$offset5.

Furthermore, in a case, for example, where really metered temperatures TRsin1–TRsin5 of the thermocouples Sin1–Sin5 are values given by multiplying estimated temperatures TEsin1–TEsin5 with a factors (ratio factors) k1–k5, the estimated wafer temperatures TEw1-TEw5 are corrected with the ratio k1–k5.

Furthermore, in a case where a relationship satisfying Formula 1 is present, the correction may be made to satisfy Formula 2.

$$TRsinm = km \cdot TEsinm - \Delta offsetm \quad (1)$$

$$Twm = km \cdot TEwm - \Delta offsetm \quad (2)$$

factors k1–k5, and offsets $\Delta$offset1–$\Delta$offset5 are given by an arbitrary method. For example, in order to remove influences of noises, TRsin1–TRsin5, and TEsin1–TEsin5 are integrated to give a factor k and an offset $\Delta$offset.

Then, the CPU 116 controls electric powers to be fed to the heaters 31–35 second by second through the electric power controllers 36–40. That is, based on corrected wafer temperatures, adaptive control is made on wafer temperatures.

For example, in a case where corrected wafer temperatures in the five zones at a time t are computed to be Twt1, Twt2, Twt3, Twt4, Twt5, and temperatures indicated by a recipe are Tt1, Tt2, Tt3, Tt4, Tt5, the control is made so that a difference between the corrected wafer temperatures and the target wafer temperatures (temperatures indicated by the recipe) can be minimum. For example, respective electric powers to be fed to the respective heaters 31–35 are controlled to have a minimum value given by method of least square, $(Twt1-Tt1)^2+(Twt2-Tt2)^2+(Twt3-Tt3)^2+(Twt4-Tt4)^2+(Twt5-Tt5)^2$.

In other words, temperatures of wafers W in the respective zones are estimated second by second, based on output signals of the thermocouples Sin1–Sin5 and Sout1–Sout5 and electric powers of the heaters 31–35 and corrected, and adaptive control is made on the respective 5 heaters 31–35 so that the corrected wafer temperatures Tw1–Tw5 can be equal to temperatures indicated by a recipe.

When the temperature increase is completed, the adaptive control is set on to retain temperatures of the respective zones (the uppermost zone, the upper zone, the middle zone, the lower zone and the lowermost zone). When a temperature recipe has the trajectory shown in FIG. 5B, the CPU 116 controls so that corrected wafer temperatures Tw1–Tw5 are 852° C. for the uppermost zone (Zone 1), 850° C. for the upper zone (Zone 2), 849° C. for the middle zone (Zone 3), 848° C. for the lower zone (Zone 4) and 846° C. for the lowermost zone (Zone 5).

After a period of time which is sufficient for the temperatures in the reaction tube 2 to be stable, processing gases are fed into the reaction tube 2, and film forming processing is started. Even during the film forming processing, the temperature control is set on so that temperatures of the wafers W in the respective zones, the uppermost zone, the upper zone, the middle zone, the lower zone and the lowermost zone can be generally most approximate to the set temperatures of the temperature recipe.

Thus, the wafers W in the respective uppermost zone, the upper zone, the middle zone, the lower zone and the lowermost zone are subjected to the film forming processing apparently at the different temperatures. However, the models and the recipes have values (values given by converting influences of variations of processing gas concentrations, and numbers and arrangements of wafers to be processed to heat) adjusted for forming homogeneous films, so that films of relatively uniform thicknesses at different planes of wafers or at a plane of a wafer can be formed.

When the film growth is completed, the feed of the film forming gases is stopped, and interior of the reaction tube 2 is cooled. During the cooling, temperatures of the wafers are estimated as required, and the estimated temperatures are corrected. When the treatment is over, the treated wafer boat 23 is unloaded.

In the batch-type heat treatment apparatus, the controller 100 has model and recipes prepared for estimating temperatures of wafers W and temperatures of the temperature sensors Sin1–Sin5. Even if wafer temperatures estimated by the controller 100 are deviated from real temperatures due to some cause, the deviations can corrected, and the corrected wafer temperatures are used to execute suitable film forming processing (heat treatment) by the adaptive control. The adaptive control can suitably control the heater 3.

Furthermore, temperature recipes are set for the respective zones so that a film thickness is uniform inter-plane and intra-plane, whereby occurrence of film thickness deviations due to gas flow rates, gas concentration distributions, temperature gradients, etc., can be suppressed.

If an average value $\Delta$Tave of $\Delta$offset1–$\Delta$offset5, and an average value kave of factors k1–k5 are given, and estimated wafer temperatures TEwm can be corrected to, e.g., kave·TEwm–$\Delta$Tave.

Then, a method for designing a model and a recipe will be explained.

The model can be an arbitrary model (multi-variations, multi-power, multi-output functions) as long as the model is a mathematical model which can estimate temperatures of wafers W in the respective zones, based on outputs (metered values) of the thermocouples Sin1–Sin5 and Sout1–Sout5 and electric powers fed to the heaters 31–35 and can identify electric powers to be fed to the heaters 31–35 to generally approximate the 5 estimated temperatures to a target temperature.

Such model can be provided by the model disclosed in, e.g., the published specification of U.S. Pat. No. 5, 517,594.

The method for designing a model and a recipe will be explained by means of the model disclosed in the published specification of U.S. Pat. No. 5,517,594.

First, in the heat treatment apparatus shown in FIG. 2, 5 sheets of test wafers each having thermocouples Swc, Swe built in at the center and a position distant from the center by 6 mm are prepared. Then, the 5 sheets of test wafers are mounted on the wafer boat 23 together with normal wafers in such a manner that the 5 sheets of test wafers is positioned each in the respective 5 zones shown in FIG. 5A. The wafer boat 23 is loaded into the reaction tube 2. Signals of high-frequency band and signals of a low-frequency band are applied to the heaters 21–35, and data , such as outputs of the thermocouples Sin1–Sin5 and Sout1–Sout5, outputs (wafer temperatures)of the thermocouples Swc, Swe on the test wafers, currents fed to the heaters, are obtained by a sampling cycle of, e.g., 1–5 seconds.

Then, temperature zones of a 100° C. interval are set in a certain temperature range of, e.g., 400–1100° C., because covering a large temperature zone by one model makes temperature estimation inaccurate.

Based on the obtained data, ARX (auto-recursion) models represented by Formula (3) are set for the respective temperature zones.

$$yt+AA1yt-1+AA2yt-2+\ldots +AAnyt-n=BB1ut-1+BB2ut-2+\ldots +BBnut-n+et \quad (3)$$

yt: a p rows and 1 column vector having as components the following contents at a time t.

Contents: variation amounts (5 components in this example) from an equilibrium temperature ybias of outputs of the thermocouples Sin1–Sin5, variation amounts (5 components in this example) from an equilibrium temperature ybias of outputs of the thermocouples Sout1–Sout5, variation amounts (5 in this example) of the thermocouple Swc set at the centers of the test wafers, and variation amounts (5 in this example) of the thermocouple Swe set at the peripheral portions of the test wafers. Accordingly, in this example, yt is a 20 rows and 1 column vector ut: an m rows and 1 column matrix having as a component, variation amounts from a heater electric power equilibrium value Ubias at a time t (in this example, the heater has 5 zones, 5 rows and 1 column)

et: an m rows and 1 column matrix having white noises as a component n: delay (of, e.g., 8)

AA1–AAn: a p rows and p columns matrix (in this example, 20 rows and 20 columns)

BB1–BBn: a p columns and m rows matrix (in this example, 20 columns and 5 rows)

The respective factors AA1–AAn, BB1–BBn are determined by method of least square or others.

The given ARX model is expressed in a space equation as shown by Formula (4).

$$A = \begin{bmatrix} -AA_1 & I_p & \cdots & 0 \\ \vdots & \vdots & \cdots & \\ -AA_n & 0 & \cdots & 0 \end{bmatrix} \quad (4)$$

$$B = \begin{bmatrix} BB_1 \\ \vdots \\ BB_n \end{bmatrix}$$

$$Kf = \begin{bmatrix} -AA_1 \\ \vdots \\ -AA_n \end{bmatrix}$$

$$C = [I_p \cdots 0]$$

AA1 . . . BBn are factors of Formula (3) and can be given by method of least square.

Based on this, a model for estimating wafer temperatures, based on temperatures Tthermo of the thermocouples (Sin1–Sin5, Sout1–Sout5) and a heater electric powers ut is given.

An output yt in Formula (3) is divided into a measurable portion St (P1 rows, one column) and a wafer temperatures Wt (P2 rows, 1 column). C is correspondingly divided into Cs and Cw, and ybias is divided into Sbias and Wbias.

A wafer temperature model is computed by Formula (5).

$$X_{t+1}=AX_t+BU_t+k_f e_t$$

$$S_t=C_s X_t+[I_{p\lambda}\ 0]e_t \quad (5)$$

A suitable Riccati equation is solved for Formula (5) to give a feedback gain L, and then the wafer temperature model is expressed by Formula (6).

$$X_{t+i}=AX_t+B(U_t+U_{bias})+L(T_{thermo}-C_s X_t+S_{bias})$$

$$T_{model\backslash\ t}=C_w X_t+W_{bias} \quad (6)$$

Here, Tmodel,t is a predicted wafer temperature.

Then, wafer temperatures are again metered on the test wafers. A wafer temperature Tmodel predicted by Formula (6) is compared with metered real values Twafer to tune the model. The tuning operation is repeated plural times as required.

In order to improve processing speed of the real film formation, dimensions of the prepared model are lowered by about 10 dimensions, and the model is stored in the heat treatment apparatus.

On the other hand, an operation program of the CPU 116 is set so that the CPU 116 operates to minimize an average time of variations of wafer temperatures estimated based on set temperature values.

Furthermore, a target temperature trajectory Ttraj(t) which enables uniform-thickness films to be formed in the respective zones, i.e., a temperature recipe is prepared.

Subsequently, control is made so that all the 5 zones follow the target temperature trajectory, and the test film forming processing is executed. After the test film forming processing, thicknesses of the formed film are measured to check variations of the film thicknesses, etc.

For example, when a film thickness of wafers on upper shelves is smaller than that of wafers on lower shelves, even though a direct cause is unknown, temperatures of the upper shelves are relatively raised, whereby the film thicknesses can be made substantially equal. Then, the temperature target trajectory Ttraj(t) is corrected by method of least square, or others so that the variations are minimum. This is the temperature recipe for the respective zones as shown in FIG. 5B. This recipe can be further tuned.

A model and a recipe for defining estimated wafer temperatures, and outputs for making the wafer temperatures equal to a target temperature can be set corresponding to a number of wafers to be processed and their arrangement and are stored in a model memory 111 and a recipe storage means 112.

Later in real film forming, the model and recipe are suitably selected and retrieved to be used in the control.

The batch-type heat treatment apparatus according to one embodiment of the present invention, and the adaptive control thereof, and a method for designing a model and recipe for the control have been explained above. However, the present invention is not limited to the above-described embodiment and can cover other various modifications and applications.

For example, although the present invention has been explained in the above-described embodiment by means of the thermal CVD system used for forming nitride films, the present invention can make treatments of arbitrary kinds, and is applicable to various batch-type heat treatment apparatus, such as CVD systems for forming other kinds of films, oxidation systems, etching systems, etc. However, models and recipes are designed for respective kinds of films to be formed.

Machines and instruments and operations are not limited to the above-described embodiment. For example, in the above-described embodiment, 5 heaters are provided, and the interior of the reaction tube 2 has 5 zones. A number of the heaters and a number of temperature zones are arbitrary. The heaters are not essentially of electric resistance-type, and can be lumps. The means for metering temperatures are not essentially the thermocouples, and can be arbitrary temperature sensors.

The model and the method for designing the model is not limited to the model and the method for designing the model disclosed in U.S. Pat. No. 5,517,594, and arbitrary models and method for designing the models can be used.

One model and/or one recipe for heat treatment apparatus of the same specifications is prepared and optimized for each heat treatment apparatus. A model and/or a recipe are thus commonly used, whereby models can be effectively prepared and tuned.

As described above, the heat treatment apparatus according to the present invention can suitably make a treatment on objects-to-be-processed loaded in the heat treating furnace in different numbers and arrangements.

What is claimed is:

1. A batch-type treatment apparatus comprising:
    a heating furnace including a heater and a temperature sensor, for an object-to-be-processed to be loaded in;
    a first-temperature-estimator for estimating a temperature of the object-to-be-processed in the heating furnace by using a model for estimating a temperature of the object-to-be-processed and by using a metered temperature output from the temperature sensor;
    a second-temperature-estimator for estimating the temperature of the temperature sensor by using the model;
    a corrector for correcting the temperature of the object-to-be-processed estimated by the first-temperature-estimator, based on the metered temperature output from the temperature sensor and the temperature of the temperature sensor estimated by the second-temperature-estimator; and
    a controller for controlling the heater, based on the temperature of the object-to-be-processed as corrected by the corrector.

2. The batch-type heat treatment apparatus according to claim 1, wherein
    the corrector includes means for giving a relationship between the temperature estimated by the second-temperature-estimator and the temperature indicated by the output of the temperature sensor, and applying to the relationship the temperature of the object-to-be-processed estimated by the first-temperature-estimator to thereby correct the temperature of the object-to-be-processed estimated by the first-temperature-estimator.

3. The batch-type heat treatment apparatus according to claim 1, wherein
    the corrector gives an offset between the temperature indicated by the output of the temperature sensor from the temperature estimated by the second-temperature-estimator, and adds the offset to the temperature estimated by the first-temperature-estimator to thereby correct the temperature of the object-to-be-processed estimated by the first-temperature-estimator.

4. The batch-type heat treatment apparatus according to claim 1, wherein
    the corrector gives a ratio of the temperature indicated by the output of the temperature sensor to the temperature of the temperature sensor estimated by the second-temperature-estimator, and multiplies the temperature of the object-to-be-processed estimated by the first-temperature-estimator with the ratio to thereby correct the estimated temperature of the object-to-be-processed.

5. The batch-type heat treatment apparatus according to claim 1, wherein
    the model is for estimating the temperature of the object-to-be-processed in the heating furnace and the temperature of the temperature sensor, based on the output of the temperature sensor and a control signal for the heater,
    the first-temperature-estimator estimates the temperature of the object-to-be-processed in the heating furnace, based on the output of the temperature sensor and the control signal for the heater, and
    the second-temperature-estimator estimates the temperature of the temperature sensor, based on the output of the temperature sensor and the control signal for the heater.

6. The batch-type heat treatment apparatus according to claim 1, wherein
    the model includes a heater control model for controlling the heater to approximate the estimated temperature of the object-to-be-processed to a target value.

7. The batch-type heat treatment apparatus according to claim 6, wherein
    the controller includes a recipe memory for storing a recipe for temperature changes to be applied to the object-to-be-processed, and
    the controller controls the temperature estimated by using the model so that the estimated temperature of the object-to-be-processed changes in accordance with the recipe stored in the recipe memory.

8. A batch-type treatment apparatus comprising:
    a heating furnace including a plurality of heaters and a plurality of temperature sensors, for objects-to-be-processed to be loaded in;
    a first-temperature-estimator for estimating temperatures of the objects-to-be-processed in the heating furnace by using a model for estimating temperatures of the objects-to-be-processed in the heating furnace and by using metered temperatures output from the temperature sensors;
    a second-temperature-estimator for estimating temperatures of the temperature sensors by using the model;
    a corrector for correcting the temperatures objects-to-be-processed estimated by the first-temperature-estimator, based on the metered temperatures output from the temperature sensors and the temperatures of the temperature sensors estimated by the second-temperature-estimator; and
    a controller for controlling the heaters, based on temperatures of the objects-to-be-processed as corrected by the corrector.

9. The batch-type heat treatment apparatus according to claim 8, wherein
    the corrector includes means for giving relationships between the temperatures estimated by the second-temperature-estimator and the temperatures indicated by the outputs of the temperature sensors, and applying to the relationship the temperatures of the objects-tobe-processed estimated by the first-temperature-estimator to thereby correct the temperatures of the objects-to-be-processed estimated by the first-temperature-estimator.

10. The batch-type heat treatment apparatus according to claim 8, wherein the corrector gives offsets between the temperatures indicated by the outputs of the temperature sensors from the temperatures estimated by the second-temperature-estimator, and adds the offsets to the temperatures estimated by the first-temperature-estimator to thereby correct the temperatures of the objects-to-be-processed estimated by the first-temperature-estimator.

11. The batch-type heat treatment apparatus according to claim 8, wherein the corrector gives ratios of the temperatures indicated by the outputs of the temperature sensors to the temperatures of the temperature sensors estimated by the second-temperature-estimator, and multiplies the temperatures of the objects-to-be-processed estimated by the first-temperature-estimator with the ratios to thereby correct the estimated temperatures of the objects-to-be-processed.

12. The batch-type heat treatment apparatus according to claim 8, wherein the model is for estimating the temperatures of the objects-to-be-processed in the heating furnace and the temperatures of the temperature sensors themselves, on the outputs of the temperature sensors and control signals for the heaters, the first-temperature-estimator estimates the temperatures of the objects-to-be-processed in the heating furnace, based on the outputs of the temperature sensors and the control signals for the heaters, and the second-temperature-estimator estimates the temperatures of the temperature sensors, based on the outputs of the temperature sensors and the control signals for the heaters.

13. The batch-type heat treatment apparatus according to claim 8, wherein the model includes a heater control model for controlling the heaters to approximate the estimated temperatures of the objects-to-be-processed to a target value.

14. The batch-type heat treatment apparatus according to claim 13, wherein the controller includes a recipe memory for storing recipes for changes of temperatures to be applied to the objects-to-be-processed, and the controller controls the temperatures estimated by using the model so that the estimated temperatures of the objects-to-be-processed changes in accordance with the recipes stored in the recipe memory.

15. The batch-type heat treatment apparatus according to claim 14, wherein the recipe memory stores recipes corrected corresponding to a plurality of zones of the interior of the heating furnace divided in the direction of arrangement of the objects-to-be-processes, and the controller controls the heaters in accordance with the recipes for the respective zones.

16. The batch-type heat treatment apparatus according to claim 15, wherein the controller controls the heaters so that offsets of sets of the estimated temperatures of the objects-to-be-processed corrected by the corrector from sets of temperatures indicated by the recipes for the plural zones are minimized.

17. A method for controlling a batch-type heat treatment apparatus comprising a heating furnace including a heater and a temperature sensor, for an object-to-be-processed to be loaded in, the method comprising:

estimating a temperature of an object-to-be-processed in the heating furnace and a temperature of the temperature sensor by using a model and by using a metered temperature output from the temperature sensor;

comparing a temperature indicated by the output of the temperature sensor with the temperature of the temperature sensor estimated by using the model;

correcting the estimated temperature of the object-to-be-processed in accordance with a comparison result; and controlling the heater in accordance with a corrected temperature of the object-to-be-processed.

18. The method for controlling a batch-type heat treatment apparatus according to claim 17, wherein the model is for estimating the temperature of the object-to-be-processed in the heating furnace and the temperature of the temperature sensor, based on the output of the temperature sensor and a control signal for the heater, and the temperature of the object-to-be-processed in the heating furnace and the temperature of the temperature sensor are estimated based on the output of the temperature sensor and the control signal for the heater.

19. A method for controlling a batch-type heat treatment apparatus comprising a heating furnace including a plurality of heaters and a plurality of temperature sensors, for objects-to-be-processed to be loaded in, the method comprising:

estimating temperatures of objects-to-be-processed in the heating furnace and temperatures of the temperature sensors by using a model and by using metered temperatures from the temperature sensors;

comparing temperatures indicated by the outputs of the temperature sensors with the temperatures of the temperature sensors estimated by using the model;

correcting the estimated temperatures of the objects-to-be-processed in accordance with comparison results; and controlling the heaters in accordance with corrected temperatures of the objects-to-be-processed.

20. The method for controlling a batch-type heat treatment apparatus according to claim 19, wherein the model is for estimating the temperatures of the objects-to-be-processed in the heating furnace and the temperatures of the temperature sensors, based on the outputs of the temperature sensors and control signals for the heaters, and the temperatures of the objects-to-be-processed in the heating furnace and the temperatures of the temperature sensors are estimated based on the outputs of the temperature sensors and the control signals for the heaters.

21. The method for controlling a batch-type heat treatment apparatus according to claim 19, wherein the heaters are controlled so that offsets of sets of the corrected estimated temperatures of the objects-to-be-processed from sets of the temperatures of the objects-to-be-processed indicated by recipes are minimized.

* * * * *